(12) United States Patent
Ovshinsky

(10) Patent No.: US 8,062,920 B2
(45) Date of Patent: Nov. 22, 2011

(54) METHOD OF MANUFACTURING A PHOTOVOLTAIC DEVICE

(75) Inventor: Stanford R. Ovshinsky, Rochester Hills, MI (US)

(73) Assignee: Ovshinsky Innovation, LLC, Bloomfield Hills, MI (US)

( * ) Notice: Subject to any disclaimer, the term of this patent is extended or adjusted under 35 U.S.C. 154(b) by 94 days.

(21) Appl. No.: 12/508,835

(22) Filed: Jul. 24, 2009

(65) Prior Publication Data

US 2011/0020973 A1  Jan. 27, 2011

(51) Int. Cl.
*H01L 21/00* (2006.01)

(52) U.S. Cl. ............... 438/66; 438/64; 438/57

(58) Field of Classification Search .......... 438/57, 438/64, 66
See application file for complete search history.

(56) References Cited

U.S. PATENT DOCUMENTS

| | | | | |
|---|---|---|---|---|
| 4,283,591 A * | 8/1981 | Boer | ............................ | 136/256 |
| 5,457,057 A * | 10/1995 | Nath et al. | ..................... | 438/67 |
| 5,554,229 A * | 9/1996 | Vogeli | ........................... | 136/259 |
| 5,681,402 A * | 10/1997 | Ichinose et al. | ............... | 136/256 |
| 5,859,397 A * | 1/1999 | Ichinose et al. | ........... | 204/157.15 |
| 6,051,778 A * | 4/2000 | Ichinose et al. | ............... | 136/256 |
| 6,113,718 A * | 9/2000 | Yamada et al. | ................. | 156/78 |
| 6,515,218 B1 * | 2/2003 | Shimizu et al. | ............... | 136/256 |

* cited by examiner

*Primary Examiner* — Luan C Thai
(74) *Attorney, Agent, or Firm* — Kevin L. Bray

(57) ABSTRACT

A photovoltaic device including a current collection element and a method of making same. The photovoltaic device includes a substrate, a conductive layer, an active photovoltaic material, a transparent electrode and a current collection element. The current collection element includes a transparent support and one or more conductive wires integrated therewith. The conductive wires are in electrical communication with the transparent electrode. Current generated by the active photovoltaic material passes to the transparent electrode. The current collection element facilitates delivery of current passing through the transparent electrode to leads that deliver the current to an external load. The method includes placing a pre-fabricated current collection element in direct contact with the transparent electrode of the photovoltaic device. The time and expense of assembling the conductive wires during fabrication of the photovoltaic device is thereby avoided and higher manufacturing speeds are achieved.

38 Claims, 5 Drawing Sheets

METHOD OF MANUFACTURING A PHOTOVOLTAIC DEVICE

FIELD OF INVENTION

This invention relates to the manufacture of photovoltaic devices. More specifically, this invention relates to a method of manufacturing a photovoltaic device that includes a current collection element, where the current collection element includes one or more conductive wires integrated with a transparent support. Most specifically, this invention relates to a method of manufacturing a photovoltaic device that includes a step of applying an integrated current collection element as a monolithic element to an underlying photovoltaic device formed on an opaque substrate in a continuous process.

BACKGROUND OF THE INVENTION

Concern over the depletion and environmental impact of fossil fuels has stimulated strong interest in the development of alternative energy sources. Significant investments in areas such as batteries, fuel cells, hydrogen production and storage, biomass, wind power, algae, and solar energy have been made as society seeks to develop new ways of creating and storing energy in an economically competitive and environmentally benign fashion. The ultimate objective is to minimize society's reliance on fossil fuels to minimize greenhouse gas production and to do so in an economically competitive way.

A number of experts have concluded that to avoid the serious consequences of global warming, it is necessary to maintain $CO_2$ at levels of 550 ppm or less. To meet this target, based on current projections of world energy usage, the world will need 17 TW of carbon-free energy by the year 2050 and 33 TW by the year 2100. The estimated contribution of various carbon-free sources toward the year 2050 goal are summarized below:

| Source | Projected Energy Supply (TW) |
| --- | --- |
| Wind | 2-4 |
| Tidal | 2 |
| Hydro | 1.6 |
| Biofuels | 5-7 |
| Geothermal | 2-4 |
| Solar | 600 |

Based on the expected supply of energy from the available carbon-free sources, it is apparent that solar energy is the best solution for reducing greenhouse emissions and alleviating the effects of global climate change.

Unless solar energy becomes cost competitive with fossil fuels, however, society will lack the motivation to eliminate its dependence on fossil fuels and will refrain from adopting solar energy on the scale necessary to meaningfully address global warming. As a result, current efforts in manufacturing are directed at reducing the unit cost (cost per kilowatt-hour) of energy produced by photovoltaic materials and products. The general strategies for decreasing the unit cost of energy from photovoltaic products are improving photovoltaic efficiency and reducing process costs.

Crystalline silicon is currently the dominant photovoltaic material because of its wide availability in bulk form and mature technology base. Crystalline silicon, however, suffers from a number of drawbacks as a photovoltaic material. Crystalline silicon, for example, possesses weak absorption of solar energy because it is an indirect gap material. As a result, photovoltaic modules made from crystalline silicon are thick, rigid and not amenable to lightweight, thin film products. The deficiencies of crystalline silicon create opportunities for new technologies. In order to be commercially viable, however, new solar technologies must provide a value proposition (cost in relation to benefit) that is superior to that of crystalline silicon.

Materials that absorb wavelengths of the solar spectrum more strongly than crystalline silicon are under active development for photovoltaic products. Representative materials include CdS, CdSe, CdTe, ZnTe, CIS (Cu—In—Se and related alloys), CIGS (Cu—In—Ga—Se and related alloys), organic materials (including organic dyes), and $TiO_2$. These materials offer the prospect of reduced material costs because their high solar absorption efficiency permits photovoltaic operation with thin films, thus reducing the volume of material needed to manufacture devices and expanding the range of applications.

Amorphous silicon (and hydrogenated and/or fluorinated forms thereof) is another attractive photovoltaic material for lightweight, efficient, and flexible thin-film photovoltaic products. Stanford R. Ovshinsky was among the first to recognize the advantages of amorphous silicon (as well as amorphous germanium, amorphous alloys of silicon and germanium, including doped, hydrogenated and fluorinated versions thereof) as a photovoltaic material. S. R. Ovshinsky also recognized the underlying physical properties and practical benefits of the nanocrystalline, microcrystalline, and intermediate range order forms of silicon, germanium, silicon-germanium alloys and related materials. For representative contributions of S. R. Ovshinsky in the area of photovoltaic materials see U.S. Pat. No. 4,217,374 (describing suitability of amorphous silicon and related materials as the active material in several semiconducting devices); U.S. Pat. No. 4,226,898 (demonstration of solar cells having multiple layers, including n- and p-doped); and U.S. Pat. No. 5,103,284 (deposition of nanocrystalline silicon and demonstration of advantages thereof); as well as his article entitled "The material basis of efficiency and stability in amorphous photovoltaics" (Solar Energy Materials and Solar Cells, vol. 32, p. 443-449 (1994)).

In addition to the identification of photovoltaic materials with stronger solar absorption, new technologies seek to lower unit cost of solar energy through process efficiency. Process efficiency can be improved by increasing process speed (throughput), adopting materials amenable to high-speed processing, simplifying process steps, and utilizing continuous (as opposed to batch) processing for as many manufacturing steps as possible.

The instant inventor, S. R. Ovshinsky, has pioneered the automated and continuous manufacturing techniques needed to produce thin film, flexible large-area solar panels based on amorphous, nanocrystalline, microcrystalline, polycrystalline or composite materials. Although his work has emphasized the silicon and germanium systems, the manufacturing techniques that he has developed are universal to all material systems. Representative contributions of S. R. Ovshinsky to the field of high speed thin film manufacturing are included in U.S. Pat. No. 4,400,409 (describing a continuous manufacturing process for making thin film photovoltaic films and devices); U.S. Pat. No. 4,410,588 (describing an apparatus for the continuous manufacturing of thin film photovoltaic solar cells); U.S. Pat. No. 4,438,723 (describing an apparatus having multiple deposition chambers for the continuous manufacturing of multilayer photovoltaic devices); and U.S. Pat. No. 5,324,553 (microwave deposition of thin film photovoltaic materials).

In addition to the intrinsic properties of the active photovoltaic material, the characteristics of the surrounding layers in the device structure are important for optimizing photovoltaic conversion efficiency. Photogenerated charge carriers that avoid recombination are ultimately transported to the surface of the active photovoltaic material. In a typical device structure, the active photovoltaic material is positioned between two electrodes (that interconnect the photovoltaic device to an external circuit) and a voltage applied across the electrodes (provided by an external source or load, or present as a built-in voltage) drives the transport of photogenerated charge carriers to the surface of the photovoltaic material. At the surface, the carriers enter the electrodes and are delivered to an external load.

High photovoltaic efficiency requires efficient transfer of photogenerated carriers from the photovoltaic material to the electrodes and efficient transport of the carriers through the electrodes to an interconnected external load. Efficient transfer can be achieved by insuring a high quality interface between the photovoltaic material and electrodes and forming ohmic contact. When the electrode materials are metals, transport through the electrodes is highly efficient and leads to no appreciable decrease in photovoltaic conversion efficiency. In many common photovoltaic device structures, however, it is not feasible to utilize metals for both contacts surrounding the photovoltaic material. In order to achieve high speed continuous production, for example, it is necessary to use a substrate that is capable of being quickly transported along a manufacturing line. The substrate must be able to withstand mechanical handling during production without fracturing.

The substrate requirements in high speed continuous manufacturing are best met by steel or other metal substrates. Steel is sufficiently durable to maintain its structural integrity during mechanical transport and is not subject to fracture under the tensile stresses produced by conveyance. Since steel retains its durability when thin (unlike more fragile substrates like glass), steel substrates provide a lightweight solution for high speed production. Steel also has high electrical conductivity and is an effective electrode material.

The drawback of steel as a substrate for photovoltaic applications is its opacity. When used as a substrate, steel blocks incident light and prevents it from interacting with the active material of a photovoltaic device. As a result, the opposing electrode of the device must be transparent to enable incident light to excite the active photovoltaic material. A number of transparent electrode materials are known, including the widely used ITO (indium tin oxide) series of transparent conductive oxides. Although functional, the known transparent conductive materials are much less conductive and have much higher sheet resistivities than metal electrode materials. The high sheet resistivity introduces series resistive (I-R) losses through the transparent electrode and degrades the current supplied by the photovoltaic device. The overall conversion efficiency suffers as a result.

The lower conductivity of transparent electrodes becomes especially disadvantageous in large-area photovoltaic devices. In order for current to reach the external leads, it is necessary for the photogenerated charge carriers to exit the photovoltaic material, enter the transparent electrode, and migrate in a direction parallel to the surface of the active photovoltaic material to the external leads that contact the perimeter of the transparent electrode. As the area of the active photovoltaic material increases, the average distance that charge carriers must travel from the interior of the transparent electrode to the perimeter increases. The increased distance increases the resistance of charge carriers that flow from the photovoltaic material to the external leads and results in a lower current and higher resistive (I-R) power loss.

To facilitate carrier transport in transparent electrodes, it is common to place a mesh of metal wires on the top (light-incident) surface. The mesh is often referred to as a current collector or current collection grid. The metal wires of the current collection grid have high conductivity and are interconnected to the leads placed in contact with the perimeter of the transparent electrode. The grid expedites transport of charge carriers to the external leads at the perimeter of the transparent electrode by providing alternative, high conductivity pathways that have the effect of lowering series resistance. In photovoltaic devices that utilize transparent electrodes, the transparent electrode is a thin film that has a thickness normal to the active photovoltaic material that is much shorter than the lateral dimension of the transparent electrode. As a result, the presence of a current collection grid on the top surface reduces the distance that charge carriers need to migrate before reaching a metallic conductor. Instead of needing to migrate over a long lateral distance to reach the metallic conductors at the perimeter, charge carriers that enter the transparent electrode need only migrate over the shorter thickness dimension of the transparent electrode to reach the metallic conductors of the current collection grid. The resistive losses of charge carriers within the transparent conductor are reduced accordingly. A shorter migration distance also reduces the residence time of charge carriers in the transparent conductor, which decreases the likelihood that charge carriers will recombine with defects. As a result, higher currents and more efficient recovery of the photogenerated charge carriers produced in the active photovoltaic material are obtained.

Since the current collector is opaque and is placed on the light-incident side of the transparent electrode, it has the effect of reducing the amount of light that reaches the active photovoltaic material. The reduction in the amount of incident light may be referred to as a "shadowing effect". In order to realize a net benefit from the current collector, the wires that comprise the grid must be thick enough to materially facilitate conduction of charge carriers from the transparent electrode, but not so thick as to appreciably diminish the amount of light that excites the active photovoltaic material. In practice, it is found that a fine mesh of wires provides the optimum benefit.

The disadvantage of current collectors from a manufacturing perspective is that they are difficult to integrate with a photovoltaic device. The process of positioning and aligning individual wires or a pre-fabricated mesh of thin wires is time-consuming, labor intensive and not readily automated. As a result, both the cost of production and time of manufacturing are increased. A need exists in the art for a simpler, more effective method for integrating a current collection grid with a transparent conductor to boost the performance of photovoltaic devices formed on opaque substrates. The method should be inexpensive, fast and easy to implement in a high speed manufacturing process.

SUMMARY OF THE INVENTION

One aspect of this invention provides a photovoltaic device. The photovoltaic device includes a substrate, a conductive material proximate to the substrate, a photovoltaic material in electrical communication with the conductive material, a transparent conductor formed over the photovoltaic material, and a current collection element formed over the transparent conductor, where the current collection element includes an integrated assembly of a transparent support and one or more conductive wires. The conductive wires may be affixed to the surface of the transparent support, recessed and protruding from the surface of the transparent support, or embedded in the transparent support while remaining in electrical communication with the transparent conductor. The device may optionally include additional layers such as bonding layers, protective layers or encapsulating layers.

Another aspect of this invention provides a method of making a photovoltaic device. The method includes forming a conductive material over a substrate, forming a photovoltaic material over the conductive material, forming a transparent electrode over the photovoltaic material, and placing a current collection element in electrical communication with the transparent electrode. The current collection element includes a transparent support or matrix having one or more metallic wires formed on the surface thereof, recessed therein or embedded therein. In one embodiment, the substrate is an opaque substrate. In another embodiment, the method is performed as a continuous process. In a further embodiment, the transparent support or matrix is a polymer.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein and including embodiments that provide positive benefits for high-volume manufacturing, are also within the scope of this invention. Accordingly, the scope of the invention is defined only by reference to the appended claims.

Figure 1:
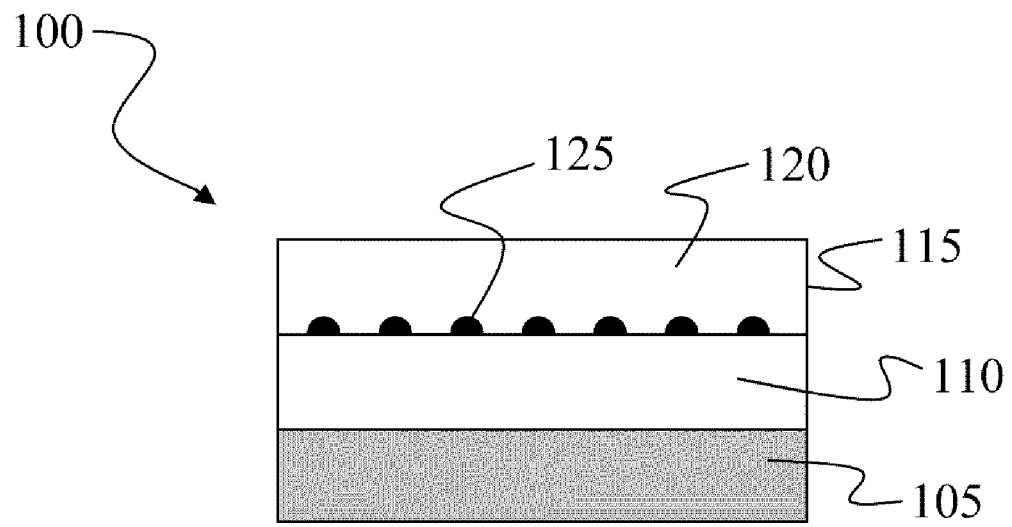
FIG. 1 depicts in side view a photovoltaic device having a current collection element.

This invention is directed to photovoltaic devices and methods of making photovoltaic devices. The photovoltaic device includes a stack of layers that include a photovoltaic material, a transparent conductor, and a current collection element. The current collection element includes a transparent support and one or more conductive wires, where the conductive wires are in electrical communication with the transparent conductor. A schematic depiction of a photovoltaic device in accordance with the instant invention is presented in side view in FIG. 1. Device 100 includes photovoltaic material 105, transparent conductor 110, and current collection element 115, where current collection element includes transparent support 120 and conductive wires 125. Conductive wires 125 are in electrical communication with transparent conductor 110.

Figure 2A:
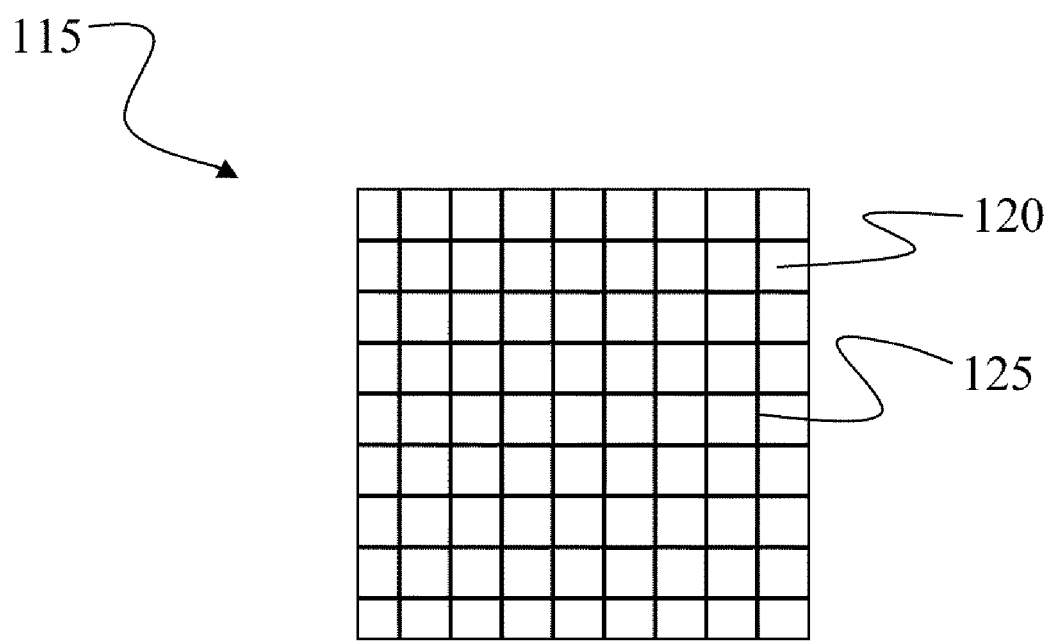
FIG. 2A depicts in bottom view a current collection element that includes a transparent support and a plurality of conductive wires arranged as a grid.
Figure 2B:
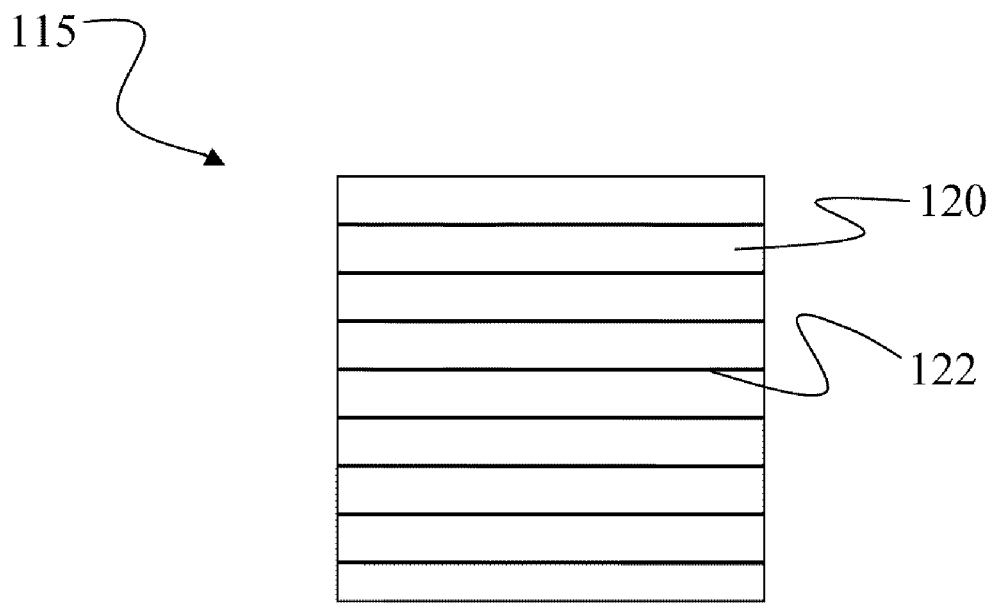
FIG. 2B depicts in bottom view a current collection element that includes a transparent support and a plurality of conductive wires arranged in parallel.
Figure 2C:
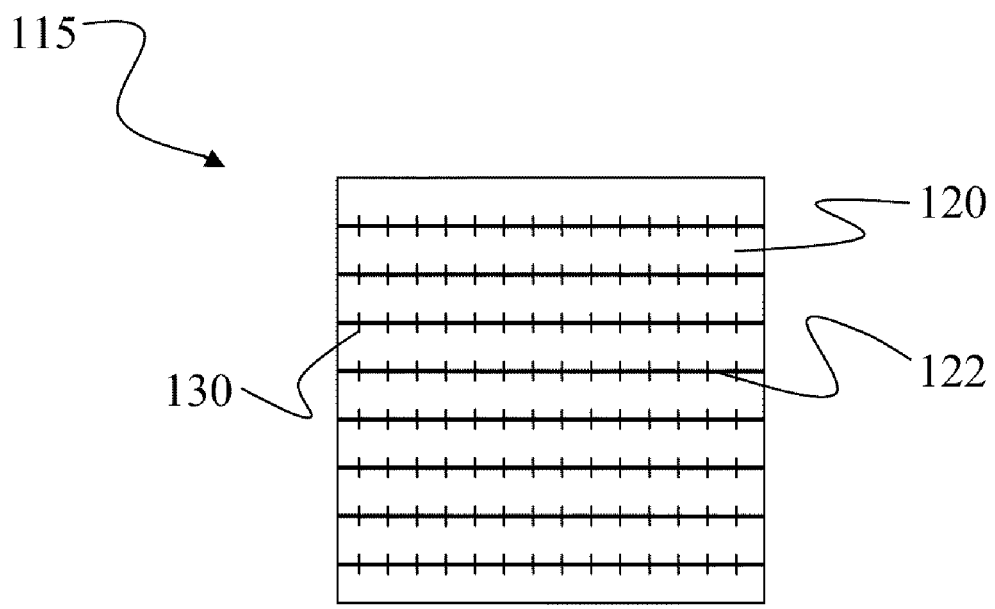
FIG. 2C depicts in bottom view a current collection element that includes a transparent support, a plurality of conductive wires arranged as a grid, and transverse secondary wires.

Conductive wires 125 may be arranged in a grid, as parallel wires, or in an arbitrary pattern. FIG. 2A depicts in bottom view an embodiment of current collection element 115 in which conductive wires 125 are arranged as a grid of horizontal and vertical wires. In the embodiment of FIG. 2A, the individual wires are uniformly spaced in a horizontal or vertical direction and have equal dimensions. In other embodiments, the wires may be arranged in non-horizontal or non-vertical directions (e.g. angled directions), may be spaced non-uniformly, and/or may differ in dimensions, material of construction, or cross-sectional shape. In still other embodiments, the conductive wires may not form a grid and may instead, for example, be arranged as a series of parallel wires or a series of non-intersecting wires. FIG. 2B shows an embodiment in which the individual wires are arranged as parallel wires 122 and FIG. 2C shows an embodiment in which secondary, non-intersecting wires 130 are arranged transversely across parallel wires 122. In this embodiment, the secondary wires 130 collect carriers and deliver them to the parallel wires. The parallel wires function as bus bars that deliver current to external leads. To reduce shadowing, the transverse secondary wires may be thinner than the central parallel wire.

Figure 2D:
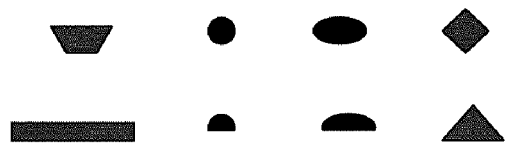
FIG. 2D depicts illustrative cross-sections of conductive wires that may be integrated with a transparent support to form a current collection element.

Conductive wires 125 may have a rounded (e.g. circular, curved, elliptical), rectilinear (e.g. square, rectangular), flat, triangular, trapezoidal, polygonal or arbitrary closed cross-section. The cross-section of conductive wires 125 may include a combination of curved and linear elements (e.g. semi-circle). The surface of conductive wires 125 may be smooth, rough, textured or irregular. Illustrative cross-sections of conductive wires 125 are shown in FIG. 2D. The instant invention further includes embodiments in which wires having two or more cross-sections are integrated with the transparent support of the same current collection element.

Figure 2E:
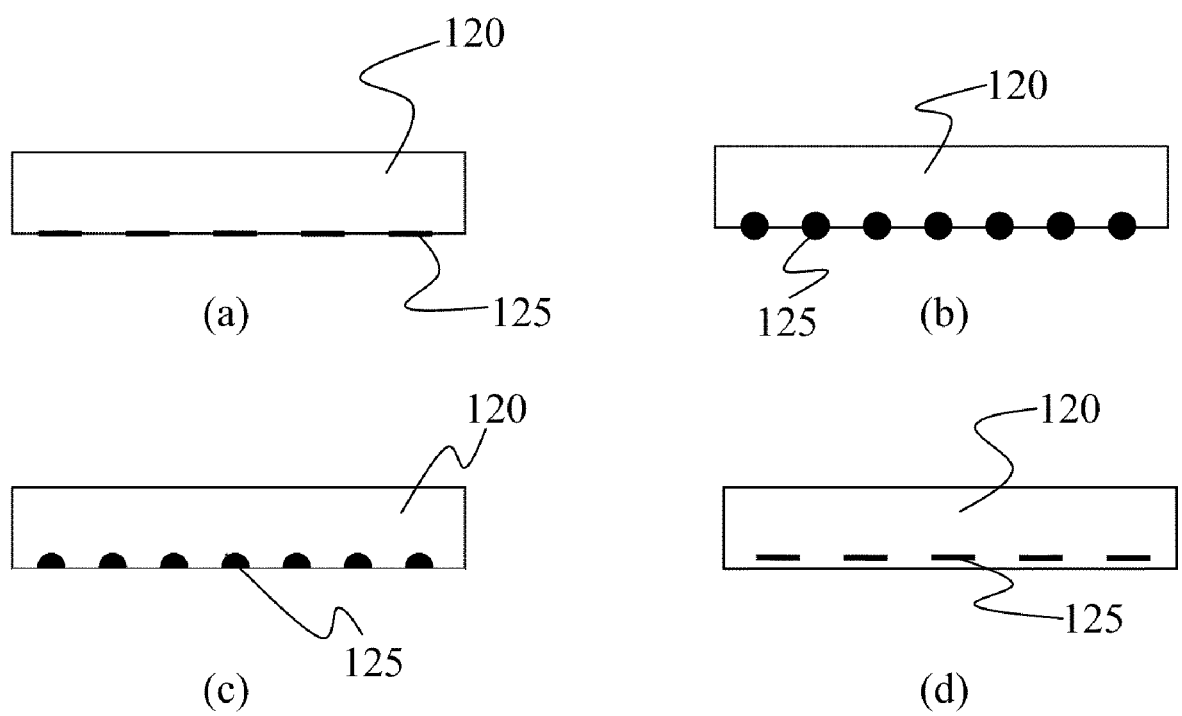
FIG. 2E depicts representative embodiments of a current collection element having surface, recessed, and embedded conductive wires.

In one embodiment, conductive wires 125 are affixed to the surface of transparent support 120. In another embodiment, conductive wires 125 are recessed in transparent support 120 and protrude from the surface of transparent support 120. In still another embodiment, conductive wires 125 are recessed in transparent support 120 and flush with the surface of transparent support 120. In a further embodiment, conductive wires 125 are wholly embedded within transparent support 120, but are sufficiently close to the surface of transparent support 120 to permit electrical communication with an adjacent transparent conductor. FIG. 2E depicts representative embodiments of a current collection element having conductive wires 125 that are (a) on the surface of transparent support 120; (b) recessed within and protruding from the surface of transparent support 120; (c) recessed within and flush with the surface of transparent support 120; and (d) embedded within transparent support 120. The instant invention further includes embodiments in which the conductive wires are placed in a combination of one or more of the foregoing positions (e.g. some conductive wires may be affixed to the surface of a transparent support, while other conductive wires of the same current collection element may be recessed or embedded within the transparent support).

The conductive wires of the instant current collection element may be any metal or metal alloy. The conductive wires preferably have a conductivity higher than that of indium tin oxide or related transparent conductive materials. Representative materials or elements that may be used for or included within the conductive wires include copper, gold, silver, steel, aluminum, iron, tungsten, titanium, nickel, chromium, or tin. The conductive wires typically have a diameter or lateral cross-sectional dimension that measures tens of microns. In one embodiment, the wires have a diameter between 10 microns and 200 microns. In another embodiment, the wires have a diameter between 50 microns and 150 microns.

The transparent support of the instant current collection element may be any material that transmits at least a portion of the solar spectrum (which includes primarily ultraviolet, visible, and infrared wavelengths of light). In a preferred embodiment, the transparent support exhibits high transmissivity of a significant fraction of the solar spectrum. The transparent support may be a crystalline, amorphous, or mixed crystalline-amorphous material. (As used herein, crystalline refers generally to any state of crystallinity including single crystalline, polycrystalline, microcrystalline, or nanocrystalline.) The transparent support may be an insulator, conductor, or semiconductor material. In one embodiment, the transparent support is a polymer or a conductive polymer. Transparent polymers include plexiglass, polyacetates (e.g. polyethylvinylacetate, polyethylenevinylacetate (EVA), polyvinylacetate), polyacrylates (e.g. polymethylmethacrylate (PMMA)), polycarbonates, olefin (e.g. polypropylene) and cyclic olefin polymers, styrenic polymers (e.g. polystyrene), polyurethanes, polyesters, polyethersulfone, polyimides, fluorinated polymers (e.g. polytetrafluoroethylene $((CH_2CF_2)_n$ or $(CHF)_n)$, polyvinylfluoride), sol-gel polymers (e.g. silica or other oxides), or inorganic-organic hybrid polymer.

Figure 3:
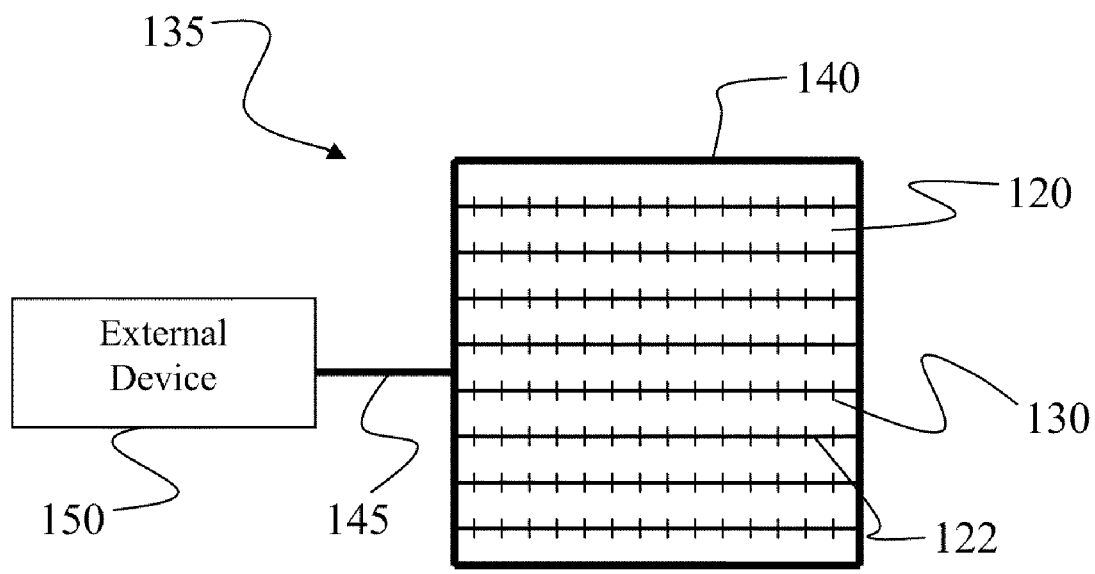
FIG. 3 depicts a current collection element interconnected to an external electrical device or storage unit via a perimeter contact.

In one embodiment, the instant photovoltaic device includes conductive leads or pads in electrical communication with the conductive wires of the current collection element. The conductive leads or pads direct current flowing through the conductive wires to external devices that are powered or charged by the instant photovoltaic device. In one embodiment, the conductive leads or pads are positioned at the perimeter of the current collection element. FIG. 3, for example, illustrates the current collection element shown in FIG. 2C in electrical communication with perimeter contacts. Current collection element 135 includes transparent support 120, conductive wires 122, secondary transverse wires 130, and perimeter contacts 140. Conductive wires 122 are in electrical communication with perimeter contacts 140. In one embodiment, conductive wires 122 are in direct contact with perimeter contacts 140. Perimeter contacts 140 may be connected to supplemental lead 145 to deliver current from current collection element 135 to external device 150. Perimeter contacts 140 are shown as circumscribing transparent support 120. In other embodiments, the perimeter contacts may not fully circumscribe the transparent support of the current collection element. The perimeter contacts may, for example, be positioned on less than all of the sides of transparent support 120 or along less than the full length of a side of transparent support 120. Individual perimeter contacts may also be provided separately for one or more of conductive wires 122.

Photovoltaic materials in accordance with the instant invention include amorphous silicon (a-Si), alloys of amorphous silicon (e.g. amorphous silicon-germanium alloys), nanocrystalline silicon, nanocrystalline alloys of silicon, microcrystalline silicon, microcrystalline alloys of silicon, and modified forms thereof (e.g. hydrogenated or fluorinated forms); crystalline silicon, CdS, CdTe, CdSe, ZnSe, ZnTe, ZnS, CIGS (Cu—In—Ga—Se and related alloys), and related materials; $TiO_2$ or other metal oxides, including doped or activated forms thereof, and organic dyes. The photovoltaic material is preferably a thin film material.

The instant invention further extends to multilayer photovoltaic materials, such as tandem devices, triple cell devices, pn devices, np devices, pin devices, and/or nip devices, where n signifies an n-type layer, i signifies an intrinsic type layer, and p signifies a p-type layer. Multilayer devices may include a plurality of active photovoltaic layers that differ in bandgap or composition. Graded bandgaps layers and graded compositions are also within the scope of the instant invention. Multiple bandgap or multiple composition devices improve overlap of the absorption characteristics of the photovoltaic device with the solar or other electromagnetic spectrum to provide improved performance.

Figure 4:
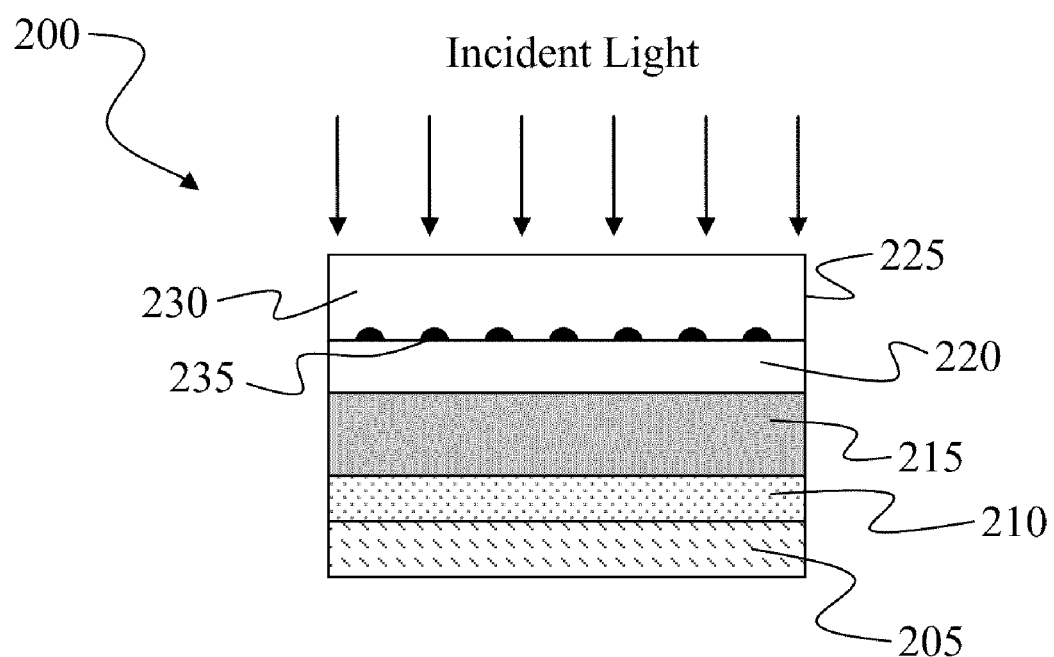
FIG. 4 depicts a photovoltaic device having a current collection element, transparent electrode, photovoltaic material, and conductive layer formed on a substrate.

The photovoltaic device of the instant invention may further include additional layers in the stack. The additional layers may include conductive layers, semiconductive layers, protective layers, and/or substrates. Semiconductive layers may include n-type and/or p-type layers. FIG. 4 depicts a photovoltaic device including multiple conductive layers formed on a substrate. Photovoltaic device 200 includes substrate 205, conductive layer 210, photovoltaic material 215, transparent electrode 220, and current collection element 225. Conductive layer 210 serves as a lower contact to photovoltaic material and transparent electrode 220 serves as an upper contact to photovoltaic material 215. Current collection element 225 includes transparent support 230 and conductive wires 235.

Photovoltaic device 200 receives incident light (depicted with arrows in FIG. 4) from the side remote from substrate 205. The incident light passes through transparent support 230 and transparent electrode 220 and is absorbed by photovoltaic material 215. Absorption of light by photovoltaic material 215 generates mobile charge carriers (electrons and holes) that are swept from photovoltaic material 215 by a voltage that is applied or that develops between conductive layer 210 and transparent electrode 220. (The voltage may be self-induced or built in through a p-n or p-i-n type structure and/or provided or assisted by an external voltage source.) The voltage effects a separation of electrons and holes and, depending on the polarity of the voltage, causes electrons to migrate to one of conductive layer 210 or transparent electrode 220 and holes to migrate to the other of conductive layer 210 or transparent electrode 220. Charge carriers entering transparent electrode 220 migrate to conductive wires 235 and are transported to one or more perimeter contacts (not shown) for delivery to an external load. As indicated hereinabove, to minimize reduction in the efficiency of generating charge carriers, it is desirable to prevent shadowing of photovoltaic material 215 by conductive wires 235. Accordingly, the lateral dimension of conductive wires 235 should be no larger than necessary to accommodate the current anticipated from photovoltaic material 215 under the expected illumination conditions.

Conductive layer 210 may be any conductive material (opaque or transparent) and may be connected to a lead or contact that delivers current to (or receives current from) an external device. Conductive layer 210 is typically a metal or metal alloy and may comprise the same material as conductive wires 235. Representative metals include copper, steel, aluminum, iron, tungsten, titanium, nickel, chromium, or tin. Substrate 205 may be an opaque or transparent (e.g. glass or clear plastic) material. As indicated hereinabove, to promote high speed manufacturing, it is desirable for substrate 205 to comprise a durable material, such as a metal (e.g. steel or aluminum) or mechanically robust plastic.

Transparent electrode 220 includes a transparent conductive material. Representative transparent conductive materials include oxides, metal oxides, indium oxide, tin oxide, indium-tin oxide (ITO), zinc oxide, and indium-zinc oxide. Aluminum doping may increase the conductivity of transparent conductive oxide materials (e.g. Al-doped ZnO).

The photovoltaic stack may also include a layer to facilitate contact of the current collection element to a transparent electrode. In order to obtain the greatest benefit from a current collection element, it is necessary to insure good electrical contact between the conductive wires and underlying transparent electrode. Poor electrical contact introduces a series resistance that results in resistive energy losses, degradation of current and diminished conversion efficiency. One strategy for improving electrical contact is to include a bonding layer between the current collection element and transparent electrode. The bonding layer is a transparent material that helps to bind the current collection element to the surface of the transparent electrode. The bonding layer improves adhesion of the current collection element to the transparent electrode and seats the conductive wires that protrude from the transparent support of the current collection element on to the transparent electrode. The bonding layer may be formed as a separate layer over the transparent electrode or may be included as a component of the current collection element that surrounds, covers or fills gaps between the conductive wires.

In an alternative embodiment, the bonding layer may be formed only between the conductive wires and the transparent electrode. In this embodiment, the bonding layer is configured to match the arrangement of conductive wires and covers only that portion of the transparent electrode that directly underlies the conductive wires. The remaining portions of the transparent electrode are not covered and are left directly exposed to the incident electromagnetic radiation. In this embodiment, the bonding layer may be comprised of an opaque material (e.g. a metal paste such as silver paste) since the bonding layer provides no shadowing in addition to the shadowing provided by the conductive wires.

In one embodiment, the bonding layer is an electrically conductive adhesive. In one embodiment, the electrically conductive adhesive comprises a thermoplastic that readily softens and flows upon mild heating to promote coating and adhesion. The thermoplastic may be rendered electrically conductive by incorporating particles of a conductive material such as silver, copper, carbon or other conductor capable of being dispersed as fine grains. In another embodiment, the adhesive is applied as a polymer solution that contains conductive particles and the solution is evaporated to provide an adhesive bonding layer. The electrically conductive adhesive may also comprise carbon resistor paste. The instant invention extends to bonding layers comprising two or more electrically conductive adhesive materials.

Figure 5:
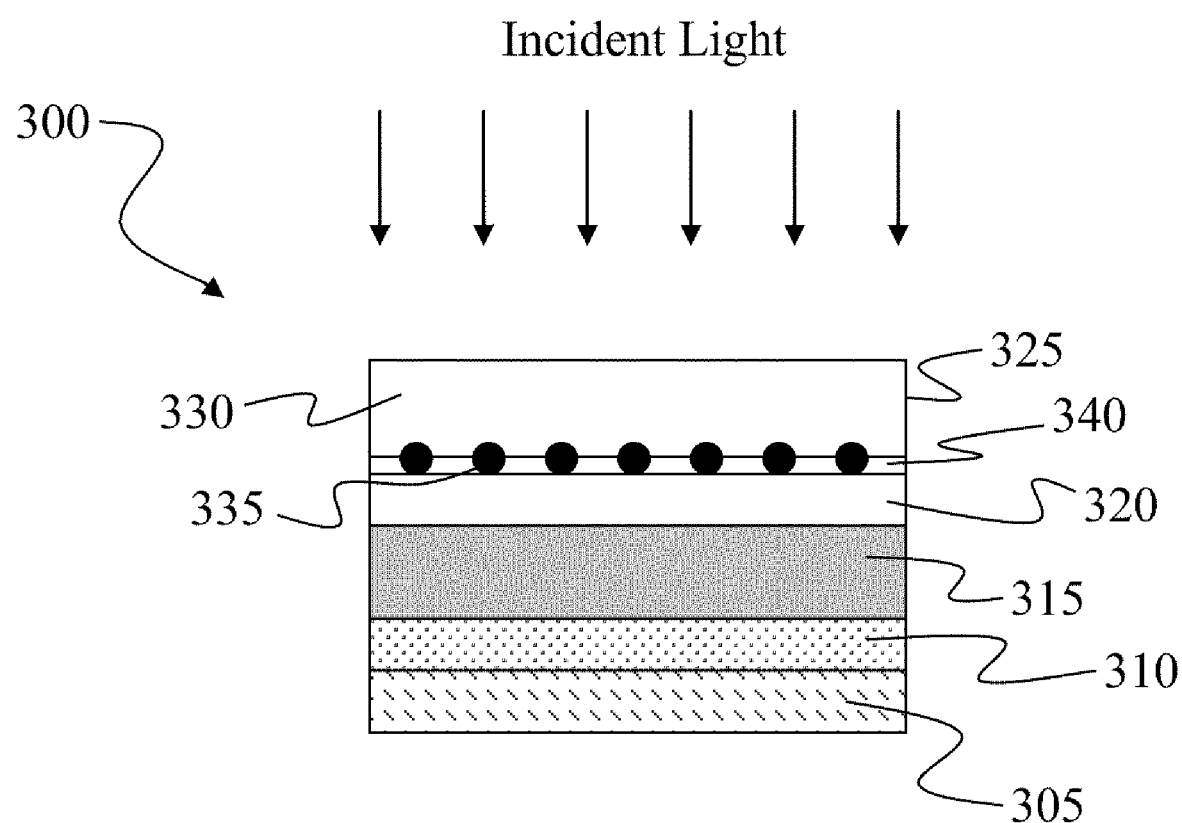
FIG. 5 depicts a photovoltaic device having a current collection element, bonding layer, transparent electrode, photovoltaic material, and conductive layer formed on a substrate.

FIG. 5 shows a device that includes a bonding layer. Device 300 of FIG. 5 includes substrate 305, conductive layer 310, photovoltaic material 315, transparent electrode 320, and current collection element 325. Conductive layer 310 serves as a lower contact to photovoltaic material and transparent electrode 320 serves as an upper contact to photovoltaic material 315. Current collection element 325 includes transparent support 330 and conductive wires 335. Device 300 further includes bonding layer 340 to aid contact of conductive wires 335 with transparent electrode 320.

The instant invention further includes a method of making a photovoltaic device. The method includes providing or forming a photovoltaic material. A transparent electrode is then formed in electrical communication with the photovoltaic material. In one embodiment, the transparent electrode is formed directly on the photovoltaic material. A current collection element is next formed in electrical communication with the transparent electrode. In one embodiment, the current collection element is formed directly on the transparent electrode. As indicated hereinabove, the current collection element includes a transparent support having one or more conductive wires integrated therewith. In this embodiment, the current collection element is a prefabricated assembly having the conductive wires arranged as a grid or other desired configuration. Use of the current collection element avoids the need, as is currently required in the prior art, to position the wires individually during manufacturing after forming a transparent electrode. As a result, the speed of manufacturing is improved.

Those skilled in the art will appreciate that the methods and designs described above have additional applications and that the relevant applications are not limited to the illustrative examples described herein. The present invention may be embodied in other specific forms without departing from the essential characteristics or principles as described herein. The embodiments described above are to be considered in all respects as illustrative only and not restrictive in any manner upon the scope and practice of the invention. It is the following claims, including all equivalents, which define the true scope of the instant invention.

I claim:

1. A method of fabricating a photovoltaic device comprising:
   providing a photovoltaic material;
   forming a transparent conductor over said photovoltaic material, said transparent conductor being in electrical communication with said photovoltaic material;
   fabricating a pre-assembled current collection element, said fabricating including integrating one or more conductive wires with a transparent support, said one or more conductive wires being disposed on a flat surface of said transparent support; and
   placing said pre-assembled current collection element in electrical communication with said transparent conductor, said electrical communication occurring between said one or more conductive wires and said transparent conductor.

2. The method of claim 1, wherein said photovoltaic material comprises silicon or germanium.

3. The method of claim 2, wherein said photovoltaic material further comprises fluorine or hydrogen.

4. The method of claim 1, wherein said photovoltaic material comprises selenium, tellurium, indium, copper, or gallium.

5. The method of claim 1, wherein said photovoltaic material comprises an amorphous material.

6. The method of claim 1, wherein said photovoltaic material comprises multiple layers.

7. The method of claim 6, wherein said multiple layers include an n-type layer and a p-type layer.

8. The method of claim 7, wherein said multiple layers further include an intrinsic layer interposed between said n-type layer and said p-type layer.

9. The method of claim 1, wherein said providing photovoltaic material includes forming said photovoltaic material.

10. The method of claim 1, wherein said transparent conductor is in direct contact with said photovoltaic material.

11. The method of claim 1, wherein said transparent conductor comprises an oxide.

12. The method of claim 11, wherein said oxide comprises a metal oxide.

13. The method of claim 11, wherein said oxide comprises indium or tin.

14. The method of claim 1, wherein said transparent support is a polymer.

15. The method of claim 14, wherein said polymer is an acetate or acrylate polymer.

16. The method of claim 14, wherein said polymer is a conductive polymer.

17. The method of claim 1, wherein said transparent support is an insulator.

18. A method of fabricating a photovoltaic device comprising:
   providing a photovoltaic material;
   forming a transparent conductor over said photovoltaic material, said transparent conductor being in electrical communication with said photovoltaic material;
   fabricating a pre-assembled current collection element, said fabricating including integrating one or more conductive wires with a transparent support, said transparent support having an exterior surface with one or more grooves separated by lands, said one or more conductive wires being positioned in said one or more grooves and protruding beyond said lands; and
   placing said pre-assembled current collection element in electrical communication with said transparent conductor, said electrical communication occurring between said one or more conductive wires and said transparent conductor.

19. The method of claim 1, wherein said one or more conductive wires are in direct contact with said transparent conductor.

20. The method of claim 1, wherein said one or more conductive wires are arranged as a grid.

21. The method of claim 1, wherein said one or more conductive wires include wires differing in a cross-sectional dimension or cross-sectional shape.

22. The method of claim 1, wherein said current collection element is in direct contact with said transparent conductor.

23. The method of claim 1, wherein said current collection element further includes one or more perimeter wires in electrical communication with said one or more conductive wires.

24. The method of claim 23, wherein said one or more conductive wires are in direct contact with said one or more perimeter wires.

25. The method of claim 1, further comprising providing a substrate, said photovoltaic material being supported by said substrate.

26. The method of claim 25, wherein said substrate is opaque.

27. The method of claim 25, wherein said substrate is a metal.

28. The method of claim 25, wherein said substrate is in continuous motion during said placing said pre-assembled current collection element in electrical communication with said transparent conductor.

29. The method of claim 25, further comprising forming a conductive material between said substrate and said photovoltaic material.

30. A method of fabricating a photovoltaic device comprising:
   providing a photovoltaic material;
   forming a transparent conductor over said photovoltaic material, said transparent conductor being in electrical communication with said photovoltaic material;
   placing a current collection element in electrical communication with said transparent conductor, said current collection element including a transparent support and one or more conductive wires integrated with said transparent support, said one or more conductive wires being in electrical communication with said transparent conductor; and
   forming a bonding layer between said transparent conductor and said current collection element, said bonding layer directly contacting said transparent conductor and said current collection element; said one or more conductive wires directly contacting said transparent conductor.

31. The method of claim 30, wherein said bonding layer comprises a thermoplastic polymer.

32. The method of claim 30, wherein said bonding layer comprises an electrically conductive adhesive.

33. The method of claim 32, wherein said electrically conductive adhesive comprises a polymer, said polymer having metal particles dispersed therein.

34. The method of claim 30, further comprising heating said bonding layer.

35. The method of claim 18, wherein said photovoltaic material comprises silicon or germanium.

36. The method of claim 18, wherein said photovoltaic material further comprises fluorine or hydrogen.

37. The method of claim 18, wherein said photovoltaic material comprises selenium, tellurium, indium, copper, or gallium.

38. The method of claim 18, wherein said photovoltaic material comprises an amorphous material.

* * * * *